United States Patent [19]
Liaw

[11] Patent Number: 5,986,328
[45] Date of Patent: *Nov. 16, 1999

[54] BURIED CONTACT ARCHITECTURE

[75] Inventor: Jhon-Jhy Liaw, Taipei, Taiwan

[73] Assignee: Taiwan Semiconductor Manufacturing Company, Ltd., Hsin-Chu, Taiwan

[*] Notice: This patent issued on a continued prosecution application filed under 37 CFR 1.53(d), and is subject to the twenty year patent term provisions of 35 U.S.C. 154(a)(2).

[21] Appl. No.: 08/926,694

[22] Filed: Sep. 10, 1997

Related U.S. Application Data

[62] Division of application No. 08/638,708, Apr. 29, 1996, Pat. No. 5,721,146.

[51] Int. Cl.$^6$ ................................................. H01L 29/40
[52] U.S. Cl. ........................... 257/621; 257/773; 257/903
[58] Field of Search ................................ 257/621, 428, 257/588, 773, 903; 438/586, 524, 666, 533, 618, 620, 597, 698, 297, 302

[56] References Cited

U.S. PATENT DOCUMENTS

| | | | |
|---|---|---|---|
| 4,648,175 | 3/1987 | Matz, Jr. et al. | 29/589 |
| 4,860,084 | 8/1989 | Shibata | 257/621 |
| 5,315,150 | 5/1994 | Furuhata | 257/588 |
| 5,543,350 | 8/1996 | Chi et al. | 437/60 |
| 5,604,159 | 2/1997 | Cooper et al. | 438/586 |
| 5,607,881 | 3/1997 | Huang | 437/195 |
| 5,679,607 | 10/1997 | Liu | 437/200 |

OTHER PUBLICATIONS

S. Wolf et al, "Silicon Processing for the VLSI Era" vol. 1, Lattiee Press, Sunset Beach, CA. 1986, p. 577–580.

*Primary Examiner*—Sara Crane
*Attorney, Agent, or Firm*—George O. Saile; Stephen B. Ackerman

[57] ABSTRACT

An method for the fabrication of an improved polysilicon buried contact is described. The contact is formed within a trench etched into the silicon substrate. The effective area of the contact is thereby increased over the conventional planar buried contact by an amount equal to the area of the trench walls. For sub-micron sized buried contacts and trenches 1000 to 3000 Angstroms deep this area can be twice that of the conventional planar buried contact. Contacts formed in this fashion are particularly beneficial in the manufacture of static-random-access memory, devices (SRAMs) through their application with local-interconnects. They afford a lower contact resistance, manifested by the greater effective contact area, as well as a much reduced risk of open or high resistive contacts due to photomask mis-alignment. The presence of the trench also results in a higher junction capacitance which affords a reduction in soft-error-rates, a notable concern for memory devices.

3 Claims, 4 Drawing Sheets

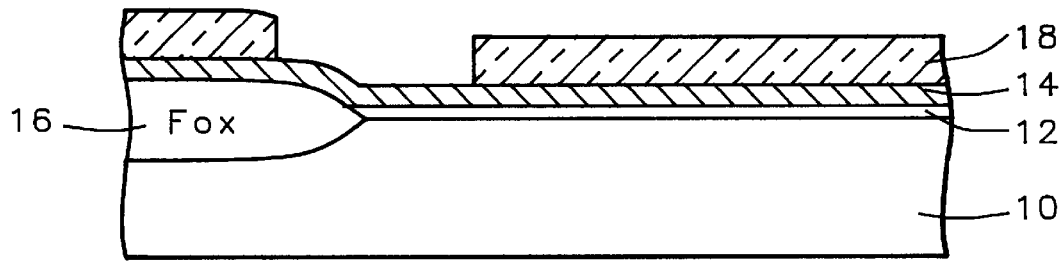
FIG. 1A – Prior Art
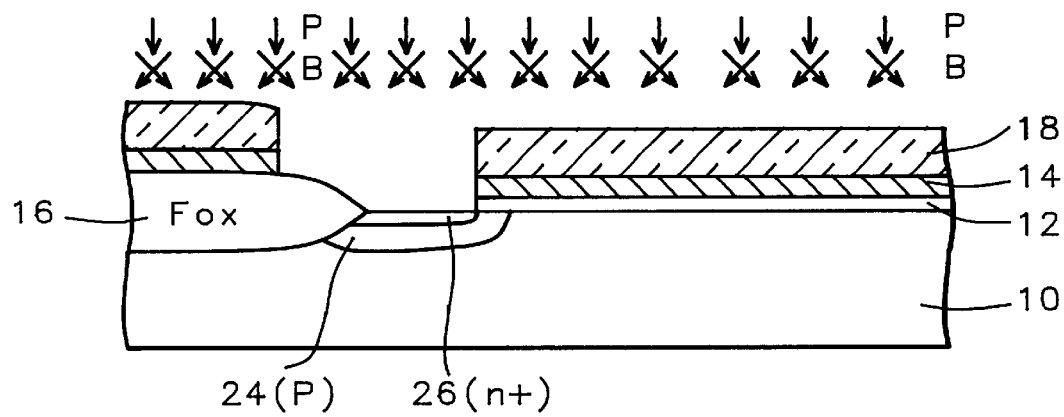
FIG. 1B – Prior Art
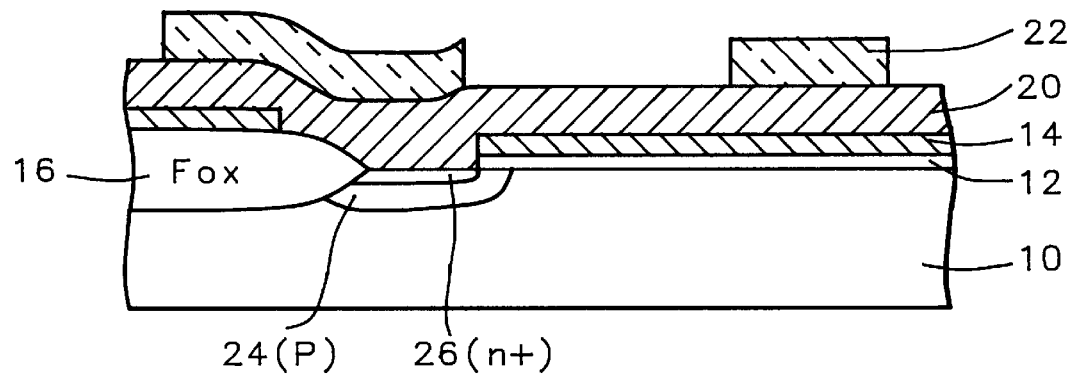
FIG. 1C – Prior Art

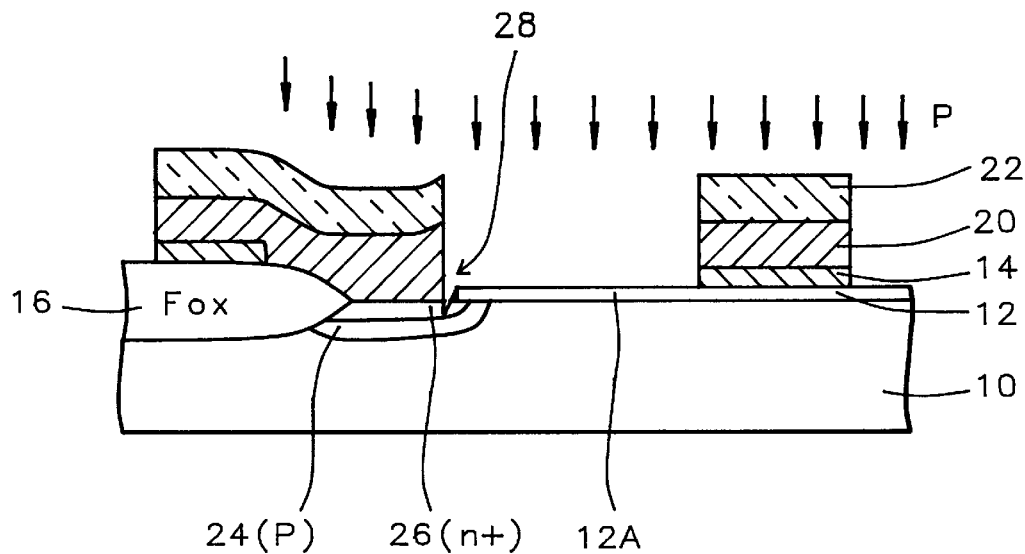
FIG. 1D – Prior Art
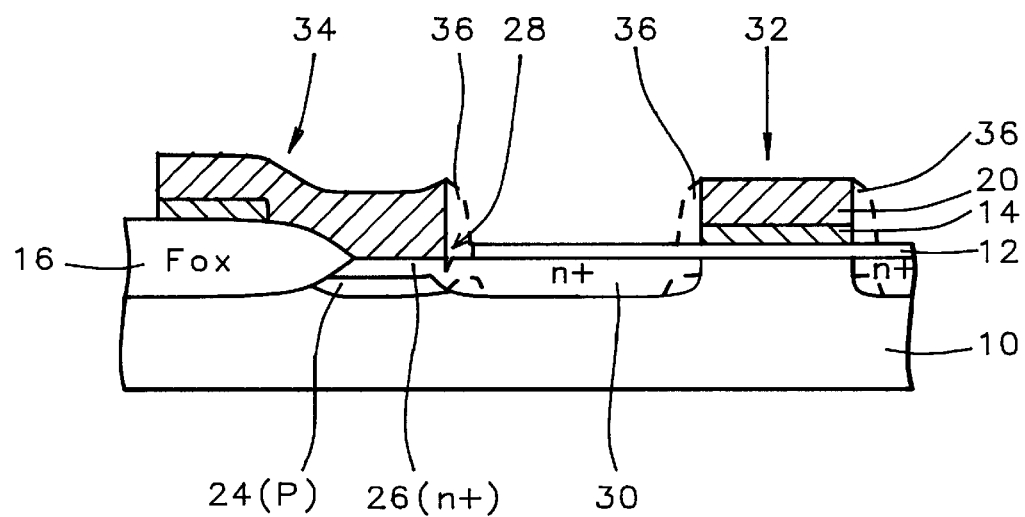
FIG. 1E – Prior Art

BURIED CONTACT ARCHITECTURE

This is a division of patent application Ser. No. 08/638,708, filing date Apr. 29, 1996, now U.S. Pat. No. 5,721,146, An Improved Buried Contact Architecture, assigned to the same assignee as the present invention.

BACKGROUND OF THE INVENTION (1) Field of the Invention

The invention relates to processes for the manufacture of semiconductor devices and more particularly to processes for forming buried contacts.

(2) Description of Prior Art

Very large scale integrated circuit (VLSI) technology comprises the formation of isolated semiconductor devices within the surface of silicon wafers and interconnecting these devices with wiring layers above the surface. This interconnection system usually consists of two or more levels of interconnection metallurgy, separated by insulation layers. The first level of interconnection is used to define small fundamental circuits, for example, a simple TTL gate comprised of two bi-polar transistors and two resistors. The basic CMOS inverter requires that the gates on the NMOS (n-channel MOS field-effect-transistor) and the PMOS (p-channel MOS field-effect-transistor) devices be connected together. Memory cells, in particular, require several such local interconnections.

The progressive need for higher densities of memory cells has fueled the development of that segment of interconnection technology which has become known as "Local Interconnects" (LI). The success and extensive use of polysilicon as the MOSFET gate material has played a dominant role in this development and, in the sub-micron technology of today, it has become the most important material used for forming these connections. Previous technology used an aluminum alloy for short wiring runs such as from a gate electrode to an adjacent drain. These links were referred to as butted contacts because the contact window was opened to expose both the polysilicon gate and the adjacent drain. With the buried contact, direct contact is made between polysilicon and the substrate. When in-situ doped polysilicon is deposited over a thin gate oxide layer to form a transistor gate it can simultaneously be deposited into an opening in the gate oxide over a nearby drain diffusion, for example, to make a contact between the gate and the drain region. Subsequent annealing then forms a stable ohmic contact to the diffused region.

Several major designs for Static Random Access Memory (SRAM) arrays have been developed using both NMOS and CMOS technology. All make abundant use of local interconnects with buried contacts. The earliest, NMOS SRAMs, contained six n-channel MOSFETs (MOS field-effect-transistor) per cell. Three local interconnects using buried contacts were used in this cell to connect polysilicon gates to substrate diffusions.

Other SRAM designs, such as full CMOS SRAMS and poly-load SRAMs, rely upon local interconnects made with buried contacts. These interconnects contribute to a reduction in cell size, allowing an increase in memory density.

A conventional sequence of steps for forming a gate-to-drain LI using a polysilicon buried contact is shown in FIG. 2. Referring first to FIG. 1A, a p-type silicon wafer 10 is provided having a field isolation region (FOX) 16 and a gate oxide 12. A thin layer of about 450 to 550 Angstroms of un-doped polysilicon 14 is deposited using Low-Pressure-Chemical-Vapor-Deposition (LPCVD). Photoresist 18 is applied and openings for the buried contacts are patterned in the resist. Using Reactive-Ion-Etching (RIE) with chlorine, the polysilicon is etched to the underlying the gate oxide which is then removed with dilute hydrofluoric acid or by RIE with tetrafluoromethane ($CF_4$).

Referring next to FIG. 1B, the wafer is first implanted with boron using the Large-Angle-Tilt-Implanted-Punchthrough-Stopper (LATIPS) process. The implanted boron 24 prevents punchthrough below the channel region and also acts as a channel-stop under the field isolation 16. Next a normal implant of phosphorous of about $1 \times 10^{15}$ to $3 \times 10^{15}$ atoms/$cm^2$ forms the region 26 within the silicon where the LI contact is to be made. A second layer of polysilicon 20 is then deposited by CVD (FIG. 1C). This layer is in-situ doped with phosphorous and will form the body of the LI as well as the gate electrode for the device. A second layer of photoresist 22 defines the LI as well as the gate electrode.

Again, using RIE with chlorine, the excess polysilicon is etched away forming the completed LI 34 and the gate electrode 32 (FIG. 1D–E). Connection of the LI 34 to the gate shown 32, or to another gate can occur over the field oxide region 16 where additional connections may also be formed. In FIGS. 1D and 1E there is shown the effect of a slight mis-alignment of the photomask which defines the LIs and gates with respect to the photomask which defines the buried contact opening. When the polysilicon is etched back, the subjacent silicon oxide layer 12A acts as an etch stop for the chlorine RIE. A mask mis-alignment can present a small portion of exposed silicon where the oxide had been previously etched away to expose the buried contact. The result is a penetration of the silicon surface 28 during the second polysilicon 20 etch. This penetration has the potential of causing an open or highly resistive contact, especially in shallow implanted devices. Note: if an oxide spacer 36 is used to create lightly-doped-drain (LDD) regions for the transistor, the region at the notch 28 will be even more jeopardized by the lack of dopant at the defect. (The LDD profile is denoted by the dashed portion in FIG. 1E).

The source and drain regions 30 as well as the polysilicon gates 32 are next implanted with phosphorous in the usual manner to complete the formation the self-aligned-polysilicon-gate MOSFETS. A subsequent thermal anneal fuses the contacts and activates the implanted dopants.

FIG. 1E shows the complete implanted drain region which consists of the implants 26 and 30. The actual contact area between the polysilicon LI 34 and the implanted region is smaller than the overall n+ region in the silicon. As device geometries shrink, this area becomes so small that contact resistances increase to unacceptable levels. Additionally, the hazards of mis-alignment become more serious with shallow junction active areas.

This invention describes a method whereby the contact area of the LI to the silicon wafer can be substantially increased without sacrificing planar device design area. Additionally, mis-alignment is made conspicuously more tolerable.

SUMMARY OF THE INVENTION

It is therefore an object of this invention to provide an improved buried contact design which has a higher contact area than the planar wafer design area which it consumes. It is a further object of this invention to provide a manufacturing method for forming said improved buried contact. In accordance with these objects the buried contact design achieves its increased contact area by being situated within a trench in the substrate silicon and thereby its area is increased by an amount equal to the area of the walls of said trench. The trench is formed by reactive-ion-etching within a portion of the active area of a semiconductor device located adjacent to a field oxide region. A large-angle-tilt ion implant introduces an anti-punchthrough region beneath the trench. In-situ doped polysilicon is then deposited into the trench to form the contact. The polysilicon extends over the field oxide region where it makes connection to other circuit elements. When used in conjunction with self-aligned gate MOSFETs the buried contacts and the gates are deposited simultaneously. No additional photomasking steps are required. The walls of the trench provide a significant augmentation to the contact area, especially when the planar area of the contact opening is in the sub-micron range. An additional improvement over prior art offered by this invention is an abatement of the effect of etch penetration caused by photomask mis-alignment.

BRIEF DESCRIPTION OF THE DRAWINGS

FIGS. 1(A–E) are cross sections of processing steps in a prior art process for forming a polysilicon buried contact.

DESCRIPTION OF THE PREFERRED EMBODIMENTS

Figure 2A:
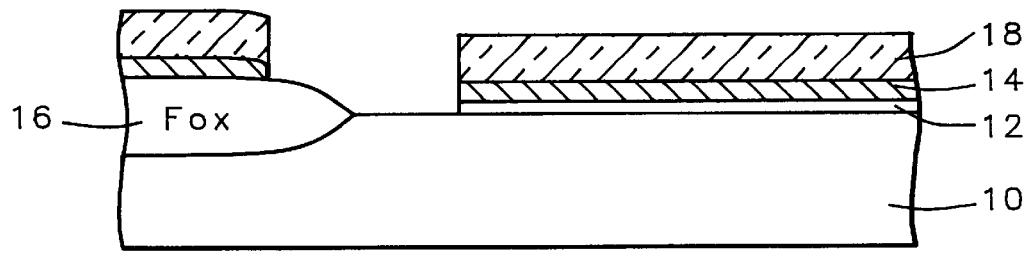
FIGS. 2(A–E) are cross sections of the processing steps for forming a polysilicon buried contact as taught by this invention.

Accordingly, a p-doped <100> oriented monocrystalline silicon wafer substrate is provided. The wafer is processed using the conventional procedure described above, to the point where the buried contact anti-punchthrough boron implant would normally be applied (FIG. 1B). Referring now to FIG. 2A, there is shown the cross section after the polysilicon and the gate oxide have been etched to expose the silicon surface in the buried contact opening.

Figure 2B:
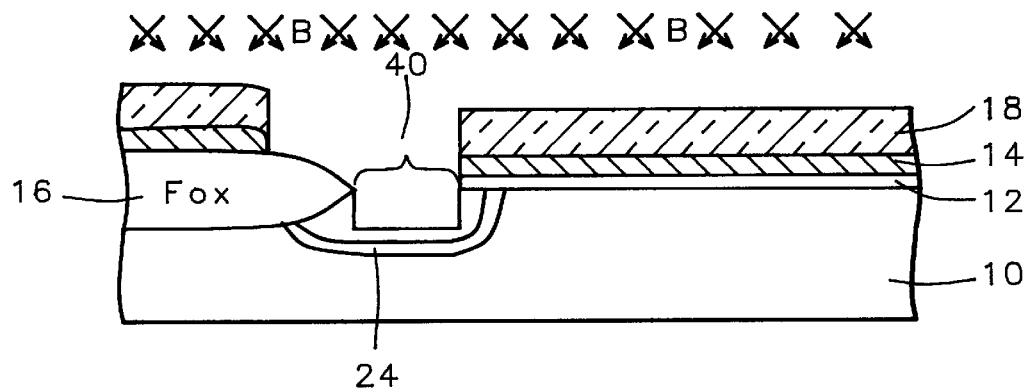

The wafer is returned to the RIE tool and, again using chlorine, a depression or trench 40 (FIG. 2B) is etched into the wafer surface in the buried contact opening. The depth of the trench is between 1,000 and 3,000 Angstroms. The etch conditions for the RIE are set to provide a trench with vertical walls with slight rounding of the lower corners.

As a further process simplification, the etching of the polysilicon 14 and the trench 40 may be carried out within the same RIE tool under the same pumpdown by merely altering the reactant gas mixture and the RIE conditions to remove the thin gate oxide layer 12. Here, Argon/chlorine or $SF_6$/chlorine is used to etch the polysilicon 14 to the gate oxide surface. The reactant gas is next changed to tetrafluoromethane ($CF_4$) to etch the oxide layer 12. Finally, the chlorine plasma is returned to complete the forming of the trench 40.

The anti-punchthrough ion-implant is next accomplished into the trench using large-angle-tilt (LAT) implantation to form the anti-punchthrough (APT) barrier 24. The APT implant consists of boron at a dose of $1 \times 10^{13}$ to $7 \times 10^{13}$ atoms/cm$^2$ at energies ranging from 60 to 180 keV. The boron is deployed at a depth of between 2,000 to 4,500 Angstroms below the silicon surface. The preferred wafer tilt angle is between 20° and 45°.

Figure 2C:
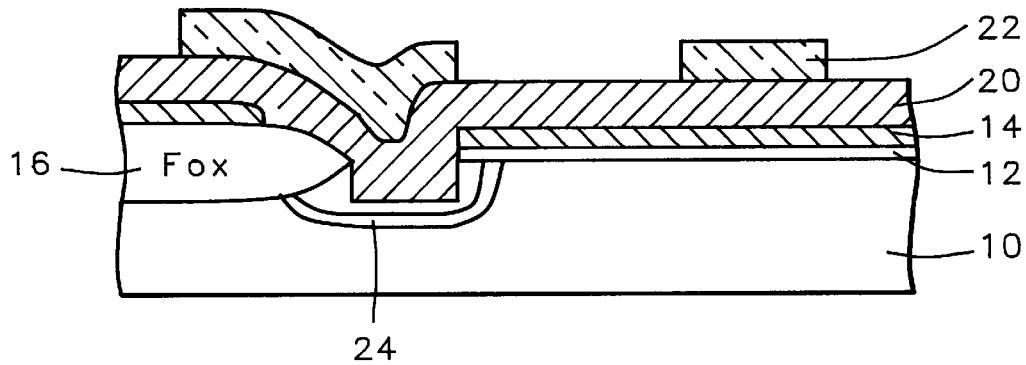

After removal of the residual photoresist 18, a second layer of polysilicon 20 is deposited using LPCVD at a temperature of 400° C. to 700° C. FIG. 2C). This layer is in-situ doped with phosphorous and will form the body of the LI as well as the gate electrode for the device. A second layer of photoresist 22 defines the LI as well as the gate electrode.

Figure 2D:
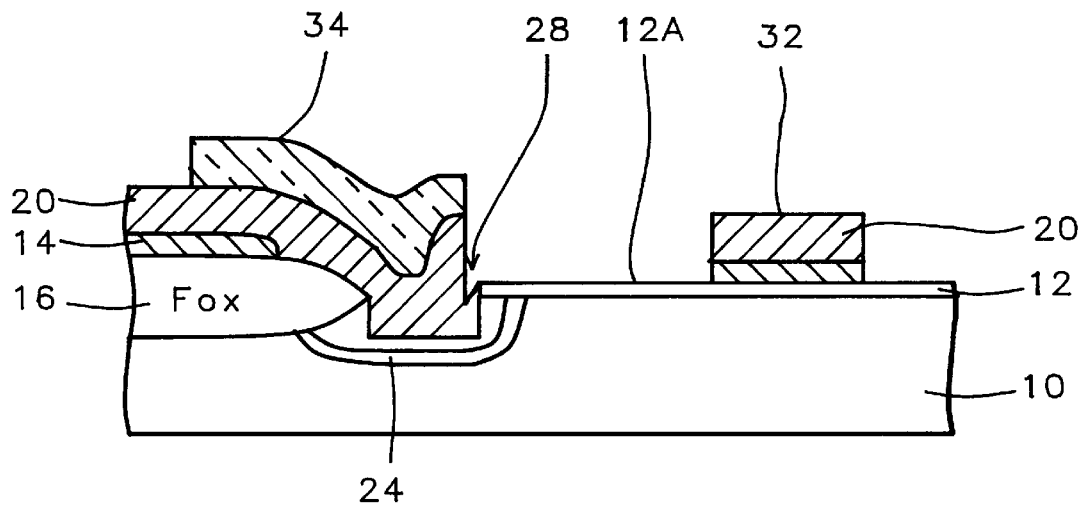

Again, using RIE with chlorine, the excess polysilicon is etched away forming the completed LI 34 and the gate structure 32 (FIG. 2D). The exposed silicon oxide layer 12A is then dip etched away as before. In this figure, we again show the effect of a slight mis-alignment of the photomask which defined the LI 34 and gate 32 with respect to the photomask which defined the buried contact opening. When the polysilicon 20 is etched back to the silicon oxide 12, the mis-alignment causes a small portion of silicon to be exposed, resulting in a penetration 28 of the RIE into the wafer surface.

Figure 2E:
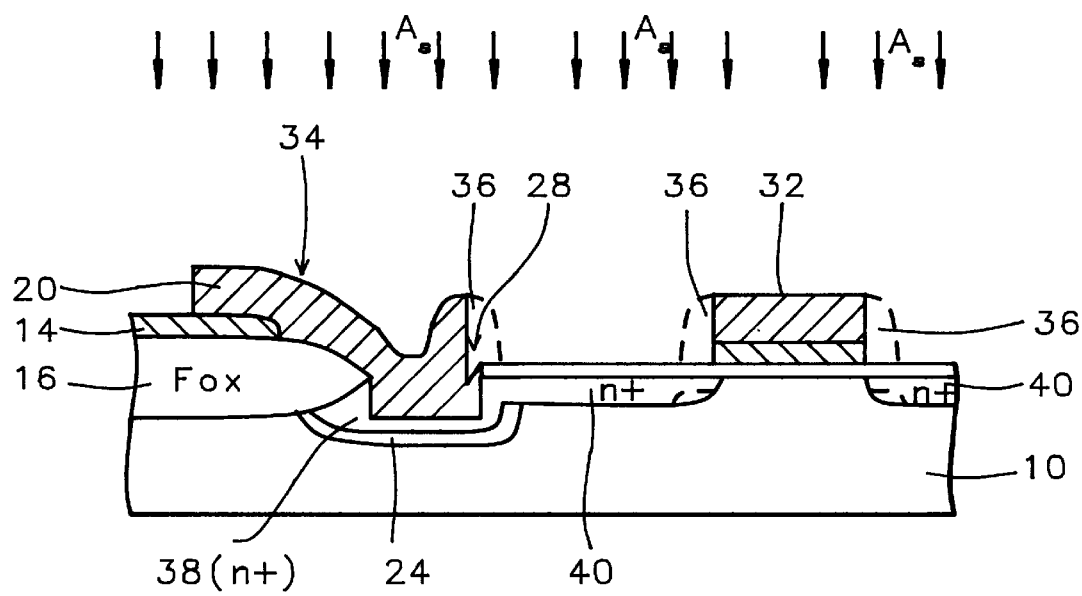

Preferring to FIG. 2E, the source and drain regions 40 as well as the polysilicon gates 32 and LIs 34 are next implanted with arsenic in the customary manner to complete the formation the self-aligned-polysilicon-gate MOSFETS.

A thermal anneal serves to fuse the contact, drive in dopant 38 from the polysilicon 34, and activate the implanted dopants 40. Any small flaw 28, caused by mask mis-alignment is now well above the floor of the n+ region 38/40 due to the presence of the trench and poses a greatly diminished risk of contact failure. Also, detrimental effects of the diminished doping at the defect 28 caused by the sidewall spacer 36 is lessened by the presence of the heavily doped trench sidewall below the defect 28. The LDD profile is denoted by the dashed lines in the source/drain regions 40.

The formation of the gates and LIs are now complete and the wafer continues further processing to incorporate the remaining interconnection metallization. A layer of Interlevel Dielectric (ILD) is applied and metal connections are made to the polysilicon LIs and gates through openings in the ILD as called for by the circuit design.

Table I gives examples of the gain in contact area by utilizing the trench buried contact of this invention compared to the conventional planar buried contact. It can be observed that significant contact area increases are possible, particularly for the smaller geometries.

TABLE I

Comparison of contact areas for Planar and Trenched Buried Contacts

| Contact Opening (μm) | Trench Depth (Å) | Contact Area (μm$^2$) | Percent Increase |
|---|---|---|---|
| 0.5 × 0.5 | 0 | 0.25 | Planar |
|  | 1,000 | 0.45 | 80 |
|  | 2,000 | 0.65 | 160 |
|  | 3,000 | 0.85 | 240 |
| 1.0 × 1.0 | 0 | 1.0 | Planar |
|  | 1,000 | 1.4 | 40 |
|  | 2,000 | 1.8 | 80 |
|  | 3,000 | 2.2 | 120 |
| 2.0 × 2.0 | 0 | 4.0 | Planar |
|  | 1,000 | 4.8 | 20 |
|  | 2,000 | 5.6 | 40 |
|  | 3,000 | 6.4 | 60 |

The embodiment of FIG. 2 uses a p-type substrate. It should be well understood by those skilled in the art that n-type substrate conductivities may also be used. It should be further understood that the substrate conductivity type as referred to here does not necessarily refer to the conductivity of the starting wafer but could also be the conductivity of a diffused region within a wafer wherein the semiconductor devices are incorporated. Such situations encountered in the twin-well CMOS technology.

Correspondingly, whereas the embodiment uses arsenic or phosphorous as the implant for the source and drain implants in a p-type well, boron would be used as the corresponding implant in an n-type well.

While the invention has been particularly shown and described with reference to the preferred embodiments thereof, it will be understood by those skilled in the art that various changes in form and details may be made without departing from the spirit and scope of the invention.

What is claimed is:

1. A buried contact on a self-aligned polysilicon gate MOSFET comprising:

a semiconductor substrate having a field isolation region adjacent to an active region of a polysilicon gate MOSFET;

a gate oxide on said active region;

an undoped polysilicon layer on said gate oxide;

a first portion of a doped polysilicon layer, having the same conductivity type as said active region, on said undoped polysilicon layer; said first portion and said undoped layer patterned to together form a gate electrode;

a trench formed in a portion of said active region distant from said polysilicon gate electrode and abutting said field isolation region on one side and said gate oxide on the other side;

a doped region within the walls and base of said trench, having the same conductivity type as, and contiguous with, said adjacent active region;

an anti-punchthrough layer below said doped region having a conductivity type opposite of that of said active region; and a second portion of said doped polysilicon layer lying within said trench in direct contiguous contact with said doped region, extending from said trench and over said field isolation region and patterned to form a gate electrode of another MOSFET.

2. The structure of claim 1 wherein the depth of the trench is between about 1,000 and 3,000 Angstroms.

3. The structure of claim 1 wherein the area of the trench in the plane of the semiconductor substrate is between about 0.04 to 4.0 square microns.

* * * * *